US008429578B2

(12) United States Patent
Yoshino

(10) Patent No.: US 8,429,578 B2
(45) Date of Patent: Apr. 23, 2013

(54) METHOD OF VERIFYING LOGIC CIRCUIT INCLUDING DECODERS AND APPARATUS FOR THE SAME

(75) Inventor: Hironobu Yoshino, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 781 days.

(21) Appl. No.: 12/547,462

(22) Filed: Aug. 25, 2009

(65) Prior Publication Data

US 2010/0058264 A1 Mar. 4, 2010

(30) Foreign Application Priority Data

Aug. 26, 2008 (JP) ................................. 2008-217244

(51) Int. Cl.
*G06F 9/455* (2006.01)
*G06F 17/50* (2006.01)

(52) U.S. Cl.
USPC ........... 716/106; 716/107; 716/110; 716/111; 716/112

(58) Field of Classification Search .................. 716/106, 716/107, 110, 111, 112
See application file for complete search history.

(56) References Cited

U.S. PATENT DOCUMENTS

| 6,490,717 | B1 * | 12/2002 | Pedersen et al. ............... | 716/104 |
| 6,842,884 | B2 * | 1/2005 | Lai et al. ......................... | 716/107 |
| 7,627,842 | B1 * | 12/2009 | Khoo et al. ..................... | 716/106 |
| 8,146,034 | B2 * | 3/2012 | Baumgartner et al. ........ | 716/107 |
| 2004/0098683 | A1 * | 5/2004 | Maruyama et al. ................ | 716/5 |
| 2006/0120167 | A1 * | 6/2006 | Bhadra et al. ............ | 365/189.01 |

OTHER PUBLICATIONS

K.C. Chen. "Memory verification needs fresh approach", Apr. 23, 2008, EETimes.com.
Bruce McGaughy, et al., "Advanced Simulation Technology and its Application in Memory Design and Verification", Memory Technology, Design, and Testing, 2005. *IEEE International Workshop on MTDT 2005*.
Higashi Naoshi, et al., "Design Methodology for Low-Power-Consumption RAM IP", Jan. 2002, *Fujitsu 53*.
Paul Hoxey et al., "An introduction to symbolic simulation", Dec. 19, 2009, EETimes.com.
Randal E. Bryant "Formal Verification of Memory Circuits by Switch-Level Simulation", Jan. 1991, *IEEE Transactions on Computer-Aided Design* vol. 10 No. 1.
Bret Siarkowski, et al., "Memory overwhelms current verification techniques", Apr. 28, 2003, EETimes.com.
Simon Napper et al., "Equivalence Checking a 256MB SDRAM", *Proceedings of the International Workshop on Memory Technology, Design, and Testing (MTDT'01)*.

* cited by examiner

*Primary Examiner* — Nha Nguyen
(74) *Attorney, Agent, or Firm* — Fujitsu Patent Center

(57) ABSTRACT

A logic verification apparatus for verifying a logic circuit includes a line recognition unit that recognizes signal lines in the circuit based on design information regarding the circuit as a starting point; a decoder recognition unit that recognizes an area including an AND gate that outputs a certain logical value and an inverter as a decoder circuit area based on the design information, and determines a logical value of an input signal inputted to the recognized decoder circuit area when a logical value of the starting point has a specific logical value; and a determination unit that determines whether a logical configuration of the recognized decoder circuit area is correct based on the number of input signals and a combination of logical values of input signals between the recognized decoder circuit areas.

10 Claims, 18 Drawing Sheets

FIG. 6

```
.global vdd vss

.subckt bitcell wl bl blb
mp0 s2 s1 vdd vdd tpr ···
mn0 s2 s1 vss vss tpr ···
mp1 s1 s2 vdd vdd tpr ···
mn1 s1 s2 vss vss tnr ···
mn2 bl wl s1 vss tnr ···
mn3 blb wl s2 vss tnr ···
.ends ···
.subckt ram
···
.ends
```

METHOD OF VERIFYING LOGIC CIRCUIT INCLUDING DECODERS AND APPARATUS FOR THE SAME

CROSS-REFERENCE TO RELATED APPLICATIONS

This application is based upon and claims the benefit of priority of the prior Japanese Patent Application No. 2008-217244, filed on Aug. 26, 2008, the entire contents of which are incorporated by reference herein.

FIELD

An embodiment of the present invention discussed herein relates to a method and an apparatus for verifying a logic circuit.

BACKGROUND

In recent years, the functionality of random access memories (RAMs) disposed inside or outside large scale integrations (LSIs) has increased. As the circuit scale of RAMs has increased, the logic configuration has become more complicated. Accordingly, the difficulty of logic verification of such RAMs with increased functionality is increasing and, therefore, it is required that logic verification is performed correctly and efficiently. In order to satisfy such a demand, the following method for verifying a logic circuit, for example, has been developed. That is, signal transition information used when logic is verified in a behavior level is used as an input vector and output expectation values in transistor-level logic verification (refer to, for example, Naoshi HIGAKI et al., "Design Methodology for Low-Power-Consumption RAM IP" Magazine Fujitsu, FUJITSU limited, January 2002, pp. 40-46).

The following three methods for testing functional equivalence are currently available to designers: logic simulation, cone-based equivalence checking, and symbolic simulation.

In logic simulation, an ideal model of a logic circuit to be realized, that is, a reference model, is written in the register transfer level (RTL) having an abstraction level higher than the gate level. In addition, implementation of an actually designed logic circuit is written using a gate-level netlist or a transistor-level netlist. Furthermore, a variety of input signals are given to the reference model and the implementation. It is then determined that the logic circuit of the implementation is correct if the output signals output from the reference model and the implementation are the same.

In this method, only a limitation that the input and output terminals of the reference model and the implementation need to be the same is required. Thus, this method is applicable to a wide variety of applications. However, in order to completely verify the logic circuit, all of the possible input signals need to be given to the reference model and the implementation. Accordingly, as the number of input signals increases, the number of combinations of the input signals significantly increases. As a result, it is difficult to completely verify the logic circuit.

In cone-based equivalence checking, a reference and an implementation are separated into logic cones representing logic groups having boundaries, such as memory elements and input and output (I/O) ports. Thereafter, formal logic equivalence checking between the reference and the implementation is performed for each of the logic cones.

In the cone-based equivalence checking, all combinations of possible input signals are verified. Accordingly, complete checking can be realized. In addition, the efficiency of checking can be advantageously increased. However, since a synthesizable logic description model is required, this method is applicable to only combinational circuits. As a result, this method is not suitable for transistor-level design or design of a memory element having a large circuit scale.

Symbolic simulation is a combination of the two methods. In the logic simulation, a logical value, such as "0" or "1" is used as an input value. However, in the symbolic simulation, a symbol is used as an input value in place of a logical value. The logical value of a symbol is "0" or "1". Accordingly, n symbols are input to n inputs (n: a natural number). Consequently, these n symbols represent $2^n$ input signals (refer to, for example, Simon Napper, Dian Yang, "Equivalence Checking a 256 MB SDRAM", Memory Technology, Design and Testing, IEEE International Workshop on 2002, August 2001, pp. 85-89, or Paul Hoxey et al., "An introduction to symbolic simulation", Dec. 19, 2005, United Business Media LLC).

This method is based on simulation. Accordingly, unlike the cone-based equivalence checking, the application targets are not limited. However, generation of a test bench in accordance with a target design is required and, therefore, it is more difficult to generate such a test bench than a test bench used for logic simulation.

As mentioned earlier, the functionality and configuration of RAMs have become complicated. Accordingly, it is desirable that equivalence checking of a RAM be efficiently performed. In general, among the above-described three methods, the logic simulation or symbolic simulation is suitable for equivalence checking of a RAM having advanced functionalities. In particular, in recent years, symbolic simulation that can provide more efficient equivalence checking has garnered much attention.

However, since symbolic simulation is a new technology, available tools for symbolic simulation are costly. In addition, the number of types of tool is limited. Furthermore, in order to perform equivalence checking, a reference model needs to be generated. Still furthermore, a test bench needs to be generated for respective targets to be checked. However, in order to generate the models and test benches, additional skill is required, as compared with that for logic simulation. Still furthermore, since the target to be checked is limited to the target defined by the test bench, complete checking is difficult.

Accordingly, it is desirable that symbolic simulation that requires a high cost and a high level of skill only be used for an area of a circuit that is as small as possible. For the other areas of the circuit, it is desirable that other equivalence checking that provides high work efficiency at lower cost be employed. In addition, such a requirement is not limited to RAMs, but widely arises for other semiconductor memories, such as read only memories (ROMs) and semiconductor circuits having a large-scale logic configuration with regularity.

SUMMARY

According to an aspect of the invention, a logic verification apparatus for verifying a logic circuit including a decoder that decodes a selection signal and selects one of signal lines, includes a line recognition unit that recognizes signal lines in the circuit based on design information regarding the circuit as a starting point; a decoder recognition unit that recognizes an area including an AND gate that outputs a certain logical value and an inverter as a decoder circuit area based on the design information, and determines a logical value of an input signal inputted to the recognized decoder circuit area when a logical value of the starting point has a specific logical value;

and a determination unit that determines whether a logical configuration of the recognized decoder circuit area is correct based on the number of input signals and a combination of logical values of input signals between the recognized decoder circuit areas.

BRIEF DESCRIPTION OF THE DRAWINGS

FIG. 6 illustrates design information;

FIG. 13 illustrates logical expression information;

FIG. 14 illustrates logical expression information;

FIG. 15 illustrates logical expression information;

FIG. 16 illustrates logical expression information;

FIG. 17 illustrates logical expression information; and

DESCRIPTION OF EMBODIMENTS

Various embodiments of the present invention are described in detail below with reference to the accompanying drawings.

Figure 1:
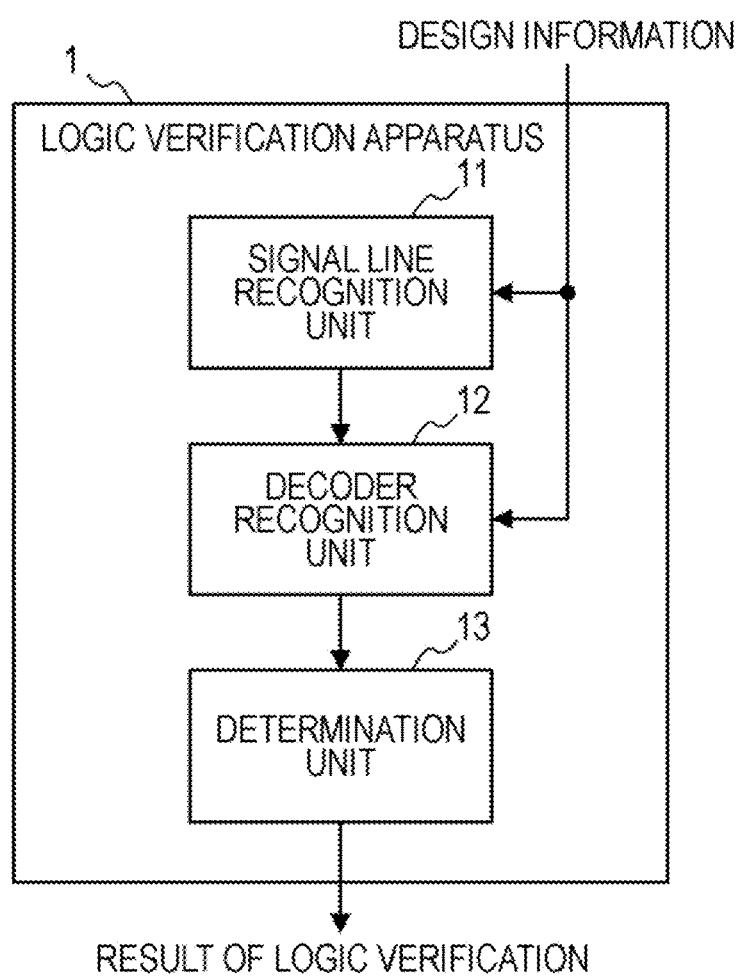
FIG. 1 illustrates a logic verification apparatus according to an embodiment of the present invention.

FIG. 1 illustrates a logic verification apparatus according to an embodiment of the present invention.

As illustrated in FIG. 1, a logic verification apparatus 1 performs logic verification of a circuit group to be verified based on design information that describes the circuit group. In this embodiment, the circuit group to be verified includes a decoder that decodes an inputted selection signal and selects one of a plurality of signal lines on the output side. The logic verification apparatus 1 automatically recognizes a circuit area for the decoder (hereinafter referred to as a "decoder circuit area") in the circuit group, and performs logic verification for the decoder circuit area.

As illustrated in FIG. 1, the logic verification apparatus 1 includes a signal line recognition unit 11, a decoder recognition unit 12, and a determination unit 13. Note that all or some of these units may be realized by, for example, running a specific logic verification program using a central processing unit (CPU) of a computer.

The signal line recognition unit 11 recognizes, based on the design information, a signal line selected by the decoder in the circuit group. For example, when a circuit including unit circuits arranged in a matrix is found, the signal line recognition unit 11 recognizes the unit circuits. Thereafter, the signal line recognition unit 11 recognizes a signal line based on a connection state among the unit circuits.

The decoder recognition unit 12 recognizes a decoder circuit area using a position of the recognized signal line and the feature of a circuit configuration of the decoder. The term "feature of a circuit configuration" refers to a phenomenon in which, when an input selection signal has a certain value, only one output signal has a value of "1". Due to such a feature, a decoder computes the logical AND of the values of input signals. The decoder recognition unit 12 recognizes a logic element located on the input side relative to a starting point, which is one of the recognized signal lines, by using such a feature and the design information. Thereafter, the decoder recognition unit 12 recognizes an area including a logic element that serves as a logic gate that outputs a logical value "1" and an inverter as a decoder circuit area.

The decoder recognition unit 12 determines the logical value of an input signal inputted to the recognized decoder area when the logical value of the signal line serving as a starting point is set to "1". The logical value of the input signal inputted to the decoder area may be considered as the value of a signal inputted to the decoder in order to select the signal line serving as the starting point. In addition, when logic elements are traced towards the input side and when, for example, an AND gate that meets a certain condition is recognized, logic elements are further traced from each of the input terminals of the recognized AND gate towards the input side. Accordingly, in general, a plurality of input signals are recognized as input signals inputted to a decoder circuit area. Each of the input signals corresponds to one of the bits of the selection signal inputted to the decoder. Accordingly, the logical values of the input signal inputted to the decoder circuit area may be considered as each of the bit values of the selection signal for selecting a signal line serving as a starting point.

The determination unit 13 verifies the logical activity of the recognized decoder circuit area. The determination unit 13 determines whether the logic configuration of the decoder circuit area is correct based on the number of input signals inputted to the decoder circuit area and a combination of logical values of the decoder circuit areas recognized by starting to use each of the signal lines.

The number of bits required for the selection signal inputted to the decoder is uniquely determined by the number of selectable signal lines. For example, in order to select one of 2n signal lines, a selection signal having n bits needs to be inputted to the decoder. In addition, a different logical value of the selection signal is used for each of the signal lines selected by the selection signal.

The determination unit 13 determines, based on such a feature of a decoder, whether the logic configuration of the decoder circuit area is correct or not. That is, the determination unit 13 determines that the logic configurations of the decoder circuit areas are correct, when the number of the input signals inputted to each of the decoder circuit areas recognized when recognition starts using one of the signal lines as a starting point is the same as the number of bits of a selection signal required for one of the signal lines, and when the logical values of the input signals inputted to the decoder circuit areas recognized when recognition starts using one of the signal lines as a starting point are different.

By using the logic verification apparatus 1, unlike the logic simulation and the symbolic simulation, logic verification of a decoder may be automatically performed without generating a reference model or a test bench. Accordingly, the efficiency of logic verification of a decoder may be increased. As a result, the efficiency of logic verification of the entire circuit group may be increased. In particular, when the scale of a circuit of a decoder associated with a selected signal line is large, the efficiency of logic verification may be further significantly increased.

Note that, in the logic verification apparatus 1, a circuit group including a decoder is a target of logic verification. However, a variety of types of circuit groups including a decoder are designed. A typical example of such a circuit group is a circuit in which specific unit circuits are arranged in an array and, in order to select any one of the unit circuits, a selection signal line connected to the unit circuit is selected by a decoder. For example, a semiconductor memory, such as a RAM or a ROM, includes arranged memory cells serving as unit circuits. In addition, an image pickup device, such as a charge coupled device (CCD), includes arranged unit circuits. In addition to a circuit including unit circuits arranged in an array, for example, a circuit in which signal lines are arranged in a one-dimensional direction and a decoder selects one of the signal lines may be verified.

Figure 2:
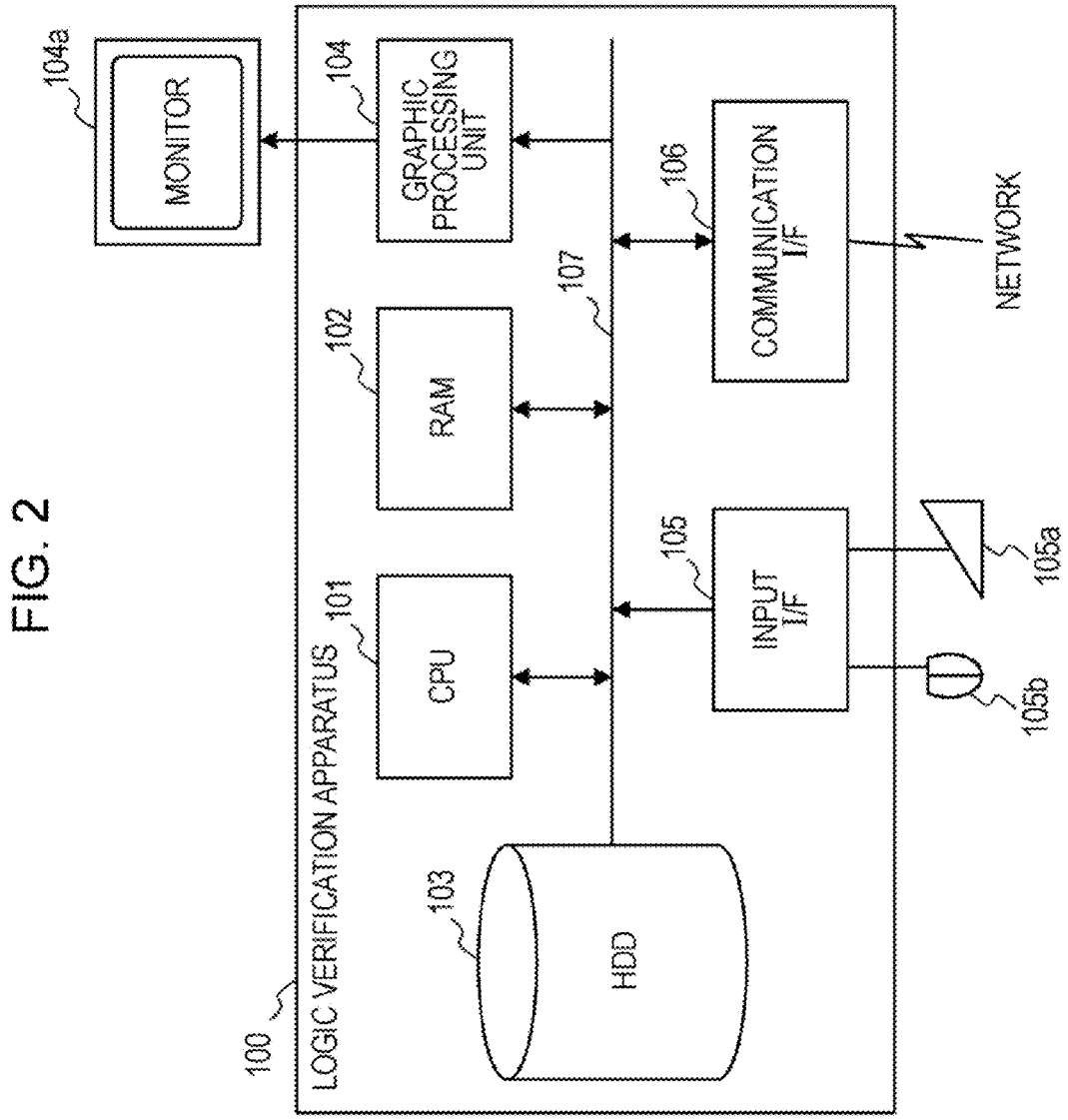
FIG. 2 illustrates a hardware configuration of a logic verification apparatus.

A function of a logic verification apparatus and an operation performed by the logic verification apparatus are described in detail next with reference to a RAM serving as a circuit group having a logic to be verified. FIG. 2 illustrates a hardware configuration of a logic verification apparatus for verifying the logic of a RAM.

According to the embodiment, a logic verification apparatus 100 is realized in the form of a computer as illustrated in FIG. 2. As illustrated in FIG. 2, the computer includes a CPU 101, a RAM 102, a hard disk drive (HDD) 103, a graphic processing unit 104, an input interface (I/F) 105, and a communication I/F 106. These units are connected to one another via a bus 107.

The CPU 101 performs overall control of the computer. The RAM 102 temporarily stores at least part of a program executed by the CPU 101 and various data required for the program. The HDD 103 stores an operating system (OS), application programs, and various data. One of the application programs is a logic verification program for performing logic verification of a RAM.

The graphic processing unit 104 has a monitor 104a connected thereto. The graphic processing unit 104 displays an image on a screen of the monitor 104a in accordance with instructions received from the CPU 101. The input I/F 105 has a keyboard 105a and a mouse 105b connected thereto. The input I/F 105 transmits signals received from the keyboard 105a and the mouse 105b to the CPU 101 via the bus 107. The communication I/F 106 is connected to a network via a communication cable. The communication I/F 106 exchanges data with other apparatuses in the network.

Figure 3:
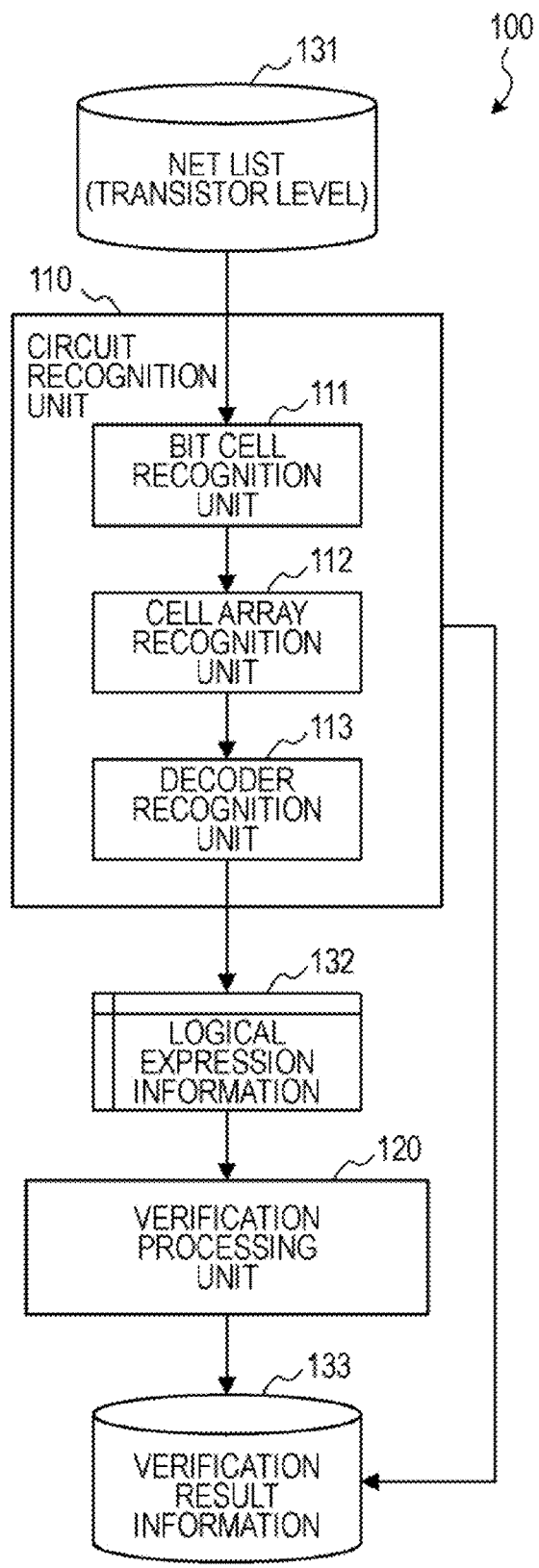
FIG. 3 illustrates a block diagram of the logic verification.

FIG. 3 is a block diagram illustrating the functionalities of the logic verification apparatus 100. The logic verification apparatus 100 includes a circuit recognition unit 110 and a verification processing unit 120. The circuit recognition unit 110 includes a bit cell recognition unit 111, a cell array recognition unit 112, and a decoder recognition unit 113. Note that these units are realized by the CPU 101 that executes a logic verification program.

The circuit recognition unit 110 receives design information regarding a circuit to be verified. In this example, the circuit to be verified is a RAM. According to the embodiment, circuit design information written in a transistor level is inputted as a netlist 131. The units of the circuit recognition unit 110 receive the netlist 131 stored in the HDD 103 and, perform the following recognition process of a circuit using the netlist 131.

The bit cell recognition unit 111 recognizes bit cells formed in the RAM to be verified. The bit cell recognition unit 111 then sends a circuit information group corresponding to each of the bit cells to the cell array recognition unit 112.

The cell array recognition unit 112 recognizes that the bit cells are connected in an array based on the connection state among the recognized bit cells. Thereafter, the cell array recognition unit 112 recognizes selection signal lines, such as word lines and bit lines used for selecting a bit cell. In addition, for example, when a multiplexer (MUX), to which a plurality of bit lines are connected, is present, the cell array recognition unit 112 recognizes the MUX and, subsequently, recognizes a bit selection signal line connected to a plurality of the MUXes.

The decoder recognition unit 113 recognizes an address decoder based on information regarding selection signal lines, such as a recognized word line, a recognized bit line, and a bit selection signal line. In this recognition process, the decoder recognition unit 113 back-traces the circuit design information using the recognized selection signal line as a starting point, i.e., traces the circuit design information towards the input side of the signal. Thus, the decoder recognition unit 113 recognizes logic elements in the circuit. In this way, the decoder recognition unit 113 recognizes the area of the address decoder. Subsequently, the decoder recognition unit 113 outputs, to the verification processing unit 120, logical expression information 132 indicating a logical expression realized in the recognized area of the address decoder.

The verification processing unit 120 verifies whether the logical configuration of the address decoder is correct or not using the logical expression information 132 acquired by the circuit recognition unit 110 and determination criteria described below. The verification processing unit 120 then outputs verification result information 133. The verification result information 133 may be stored in the HDD 103 for example.

When an error is found in the circuit configuration by the circuit recognition unit 110, information about the error may be stored in the verification result information 133.

Such processing performed by the above-described units will be described in more detail with reference to an example configuration of a circuit to be verified.

Figure 4:
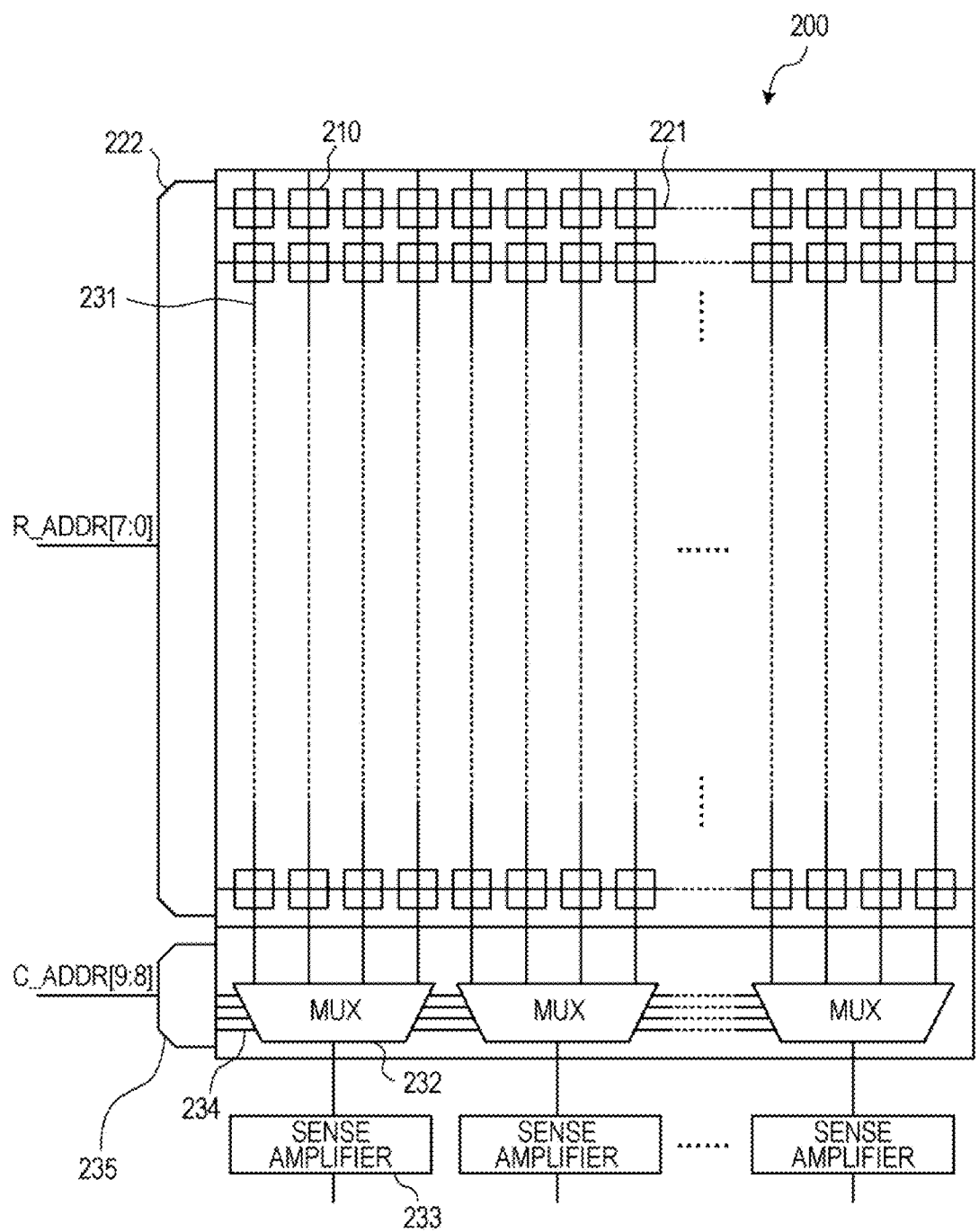
FIG. 4 illustrates a circuit configuration of a RAM to be verified.

FIG. 4 is a schematic illustration of a RAM circuit to be verified. As illustrated in FIG. 4, a RAM 200 includes bit cells 210 arranged in an array. Word lines 221 are commonly connected to a horizontal line of the bit cells 210. The word lines 221 are connected to a row address decoder 222. The row address decoder 222 receives an address signal R_ADDR for specifying one of the word lines 221. The row address decoder 222 then decodes the address signal R_ADDR and selects the specified word line 221. Note that, for example, when 256 lines of the bit cells 210 are arranged in the vertical direction, the input address signal R_ADDR is 8-bit data.

On the other hand, each of bit lines 231 is commonly connected to a corresponding vertical line of the bit cells 210. In the example shown in FIG. 4, four neighboring bit lines 231 are connected to a corresponding one of MUXes 232. Thus, an input and output signal passing through one of the bit lines 231 is selected by each of the MUXes 232. Thereafter, the signals transmitted through the selected bit lines 231 are outputted from the MUXes 232 via sense amplifiers 233 in parallel.

Bit selection signal lines 234 are commonly connected to each of the MUXes 232. The bit selection signal lines 234 are also connected to a column address decoder 235. The column address decoder 235 receives an address signal C_ADDR used for specifying one of the bit lines 231. The column address decoder 235 then decodes the address signal C_ADDR and selects one of the bit lines 231 connected to each of the MUXes 232 using the bit selection signal lines 234. Note that, in FIG. 4, the address signal C_ADDR is 2-bit data. The column address decoder 235 decodes the address signal C_ADDR and selects one of the four bit selection signal lines 234. In this way, one of the bit lines 231 connected to the MUX 232 is selected.

In the RAM 200, except for the bit cells 210, large components are the row address decoder 222 and the column address decoder 235. Accordingly, the amount of verification work for the row address decoder 222 and the column address decoder 235 makes up almost all of the verification work of the RAM 200.

For this reason, the logic verification apparatus 100 automatically performs logic verification work of the row address decoder 222 and the column address decoder 235 in a simplified manner based on the features of the circuit configurations. Accordingly, the load imposed on a RAM designer may be significantly reduced when the designer performs a logic verification work for the entire RAM circuit.

Figure 5:
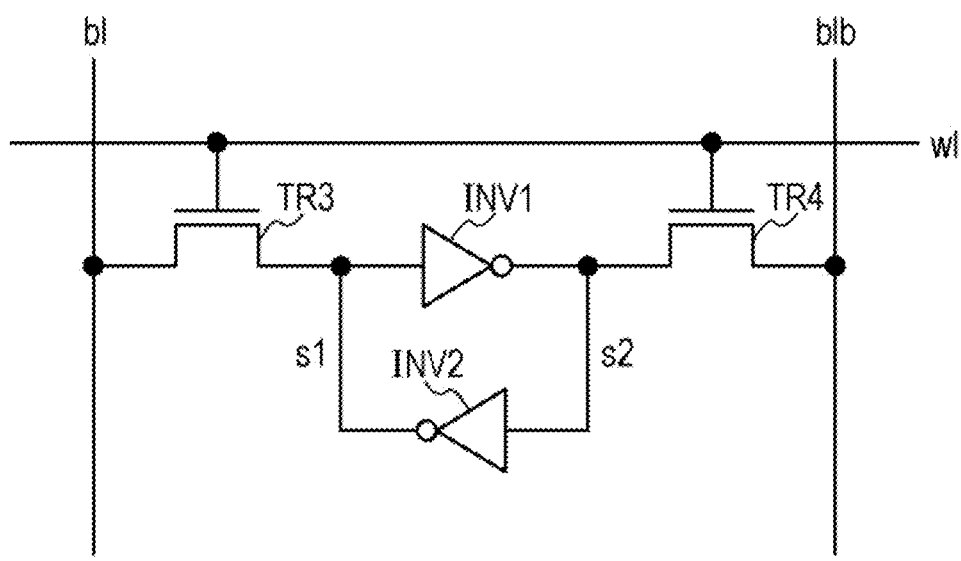
FIG. 5 illustrates a circuit configuration of a bit cell.

FIG. 5 is an example of the circuit configuration of a bit cell.

In FIG. 5, a circuit configuration of each of the bit cells 210 when the RAM 200 is a static RAM (SRAM) is illustrated. As illustrated in FIG. 5, the circuit includes inverters INV1 and INV2 and transistors TR3 and TR4. The inverters INV1 and INV2 are loop-connected with each other. The inverters INV1 and INV2 have a data holding function. An input terminal of the inverter INV1 is connected to a bit line bl via the transistor TR3. An output terminal of the inverter INV2 is connected to a bit line blb via the transistor TR4. In this configuration, four pairs of bit lines, each consisting of the bit lines bl and blb, are connected to each of the MUXes illustrated in FIG. 4. One of four pairs of bit lines is selected by the address signal C_ADDR. In addition, a word line wl is connected to the gate of the transistor TR3 and the gate of the transistor TR4.

When data is written to such a bit cell, an inverted signal of the bit line bl flows in the bit line blb. At that time, when the word line wl is selected, the transistors TR3 and TR4 are turned on. Accordingly, data formed in accordance with the values of the bit lines bl and blb is input to the bit cell. Thereafter, even when the transistors TR3 and TR4 are turned off, the input data may be preserved. In contrast, when data is read from the bit cell, the word line wl is selected, and the transistors TR3 and TR4 are turned on. Accordingly, data preserved in the bit cell is output via the bit lines bl and blb.

FIG. 6 illustrates design information corresponding to the circuit configuration illustrated in FIG. 5. In FIG. 6, the RAM 200 is represented in the form of a SPICE-based netlist. The description of an area 301 represents the bit cell having the configuration illustrated in FIG. 5.

The description from the second line to the sixth line in the area 301 represents transistors of the bit cell and the connection states of the transistors. From the top of each line, the name of a transistor, a signal line connected to the drain terminal, a signal line connected to the gate terminal, and a signal line connected to the source terminal are written.

For example, the second line indicates the transistor name "mp0" representing a p-channel metal-oxide-semiconductor (MOS) transistor. In addition, the second line indicates that signal lines s2 and s1 illustrated in FIG. 5 and a power supply line vdd (not shown) are connected to the drain, gate, and the source of the transistor, respectively. Furthermore, the third line indicates the transistor name "mn0" representing an n-channel MOS transistor. In addition, the third line indicates that the signal lines s2 and s1 and a power supply line vss are connected to the drain, gate, and the source of the transistor, respectively. That is, the second and third lines of the netlist illustrated in FIG. 6 represent the inverter INV1 illustrated in FIG. 5.

Similarly, the third and fourth lines of the netlist illustrated in FIG. 6 represent the inverter INV2 illustrated in FIG. 5. The fifth line represents the transistor TR3. The sixth line represents the transistor TR4.

Exemplary processing performed by the circuit recognition unit 110 is described next.

Figure 7:
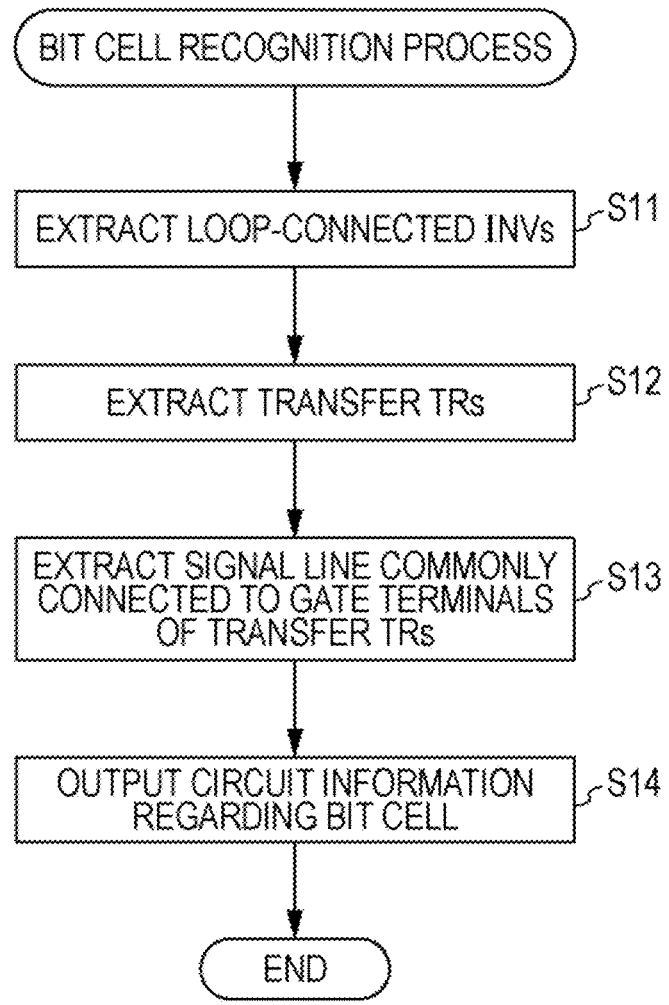
FIG. 7 is a flowchart illustrating processing performed by a bit cell recognition unit.

As described above, the bit cell recognition unit 111 recognizes a bit cell based on the netlist of the RAM 200. When the netlist as illustrated in FIG. 6 is inputted, the bit cell recognition unit 111 may extract, from the netlist, information indicating the circuit configuration of a bit cell by recognizing the declaration statement written in the first line of the area 301 illustrated in FIG. 6. Alternatively, the bit cell recognition unit 111 may extract, from the netlist, information indicating the circuit configuration of a bit cell without using the declaration statement through the following processing as illustrated in FIG. 7. Still alternatively, after extracting the information regarding a bit cell using the declaration statement, the bit cell recognition unit 111 may examine whether the extracted information is related to a bit cell through the processing as illustrated in FIG. 7.

FIG. 7 is a flowchart illustrating processing performed by the bit cell recognition unit 111.

The bit cell recognition unit 111 extracts loop-connected inverters from the netlist (S11). In the example of FIG. 5, the inverters INV1 and INV2 are extracted in S11. Subsequently, the bit cell recognition unit 111 extracts transfer transistors connected to either end of the extracted loop circuit (S12). In the example of FIG. 5, the transistors TR3 and TR4 are extracted in S12. Thereafter, the bit cell recognition unit 111 extracts a signal line commonly connected to the gate terminals of the extracted transfer transistors (S13). In the example of FIG. 5, the word line wl is extracted in S13.

When a loop circuit of the inverters and two transfer transistors are extracted through the processing in S11 to S13, the bit cell recognition unit 111 recognizes that the extracted circuit group is a bit cell. The bit cell recognition unit 111 then outputs a circuit information group indicating the circuit group recognized as a bit cell to the cell array recognition unit 112 (S14).

Note that the above-described processing is an example of processing for recognizing a bit cell having the configuration as illustrated in FIG. 5. In order to recognize a bit cell having a different configuration, a recognition algorithm in accordance with the configuration of a bit cell is applied. For example, when the target to be verified is a dynamic RAM (DRAM), a bit cell may be recognized by extracting a capacitor that preserves data and a variety of transistors connected to the capacitor from the circuit design information. In addition, when the target to be verified is an SRAM and if no bit cell is recognized through the recognition processing illustrated in FIG. 7, another recognition algorithm for recognizing a bit cell having a different configuration may be then applied.

Figure 8:
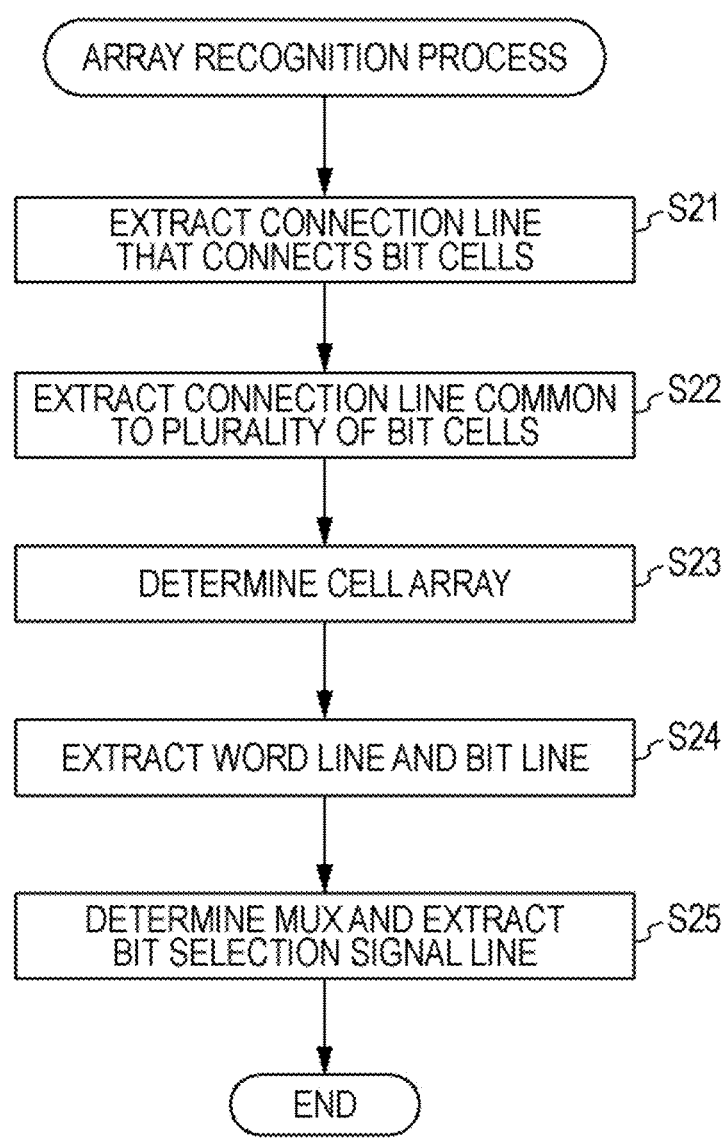
FIG. 8 is a flowchart illustrating processing performed by a cell array recognition unit.

FIG. 8 is a flowchart illustrating processing performed by the cell array recognition unit 112.

As mentioned earlier, the cell array recognition unit 112 recognizes a selection signal line used for selecting a bit cell based on the connection state among recognized bit cells. Accordingly, the cell array recognition unit 112 first extracts connection lines that connect the recognized bit cells with one other (S21). Subsequently, the bit cell recognition unit 111 extracts, from among the extracted connection lines, the connection lines each commonly connected to a plurality of the bit cells (S22).

When a common connection line is extracted in S22, the cell array recognition unit 112 determines whether the bit cells are arranged in an array when it is assumed that the extracted connection line is a word line or a bit line (S23). At that time, when a correct cell array has not been established, the cell array recognition unit 112 outputs error information. For example, when the number of the bit cells connected to each of the word lines or the bit lines is different, a correct cell array is not established. The error information outputted from the cell array recognition unit 112 is written in, for example, the verification result information 133.

In contrast, when a correct cell array has been established, the cell array recognition unit 112 extracts a word line and a bit line contained in the cell array (S24). Thereafter, the cell array recognition unit 112 determines whether a circuit to which a plurality of bit lines are commonly connected is present. When a plurality of circuits that satisfy the determination condition are present and if a signal line (corresponding to a bit selection signal line) is commonly connected to the plurality of circuits, the cell array recognition unit 112 determines that the circuits are MUXes (corresponding to the MUXes 232 illustrated in FIG. 4). The cell array recognition unit 112 then extracts the bit selection signal line (S25).

Figure 9:
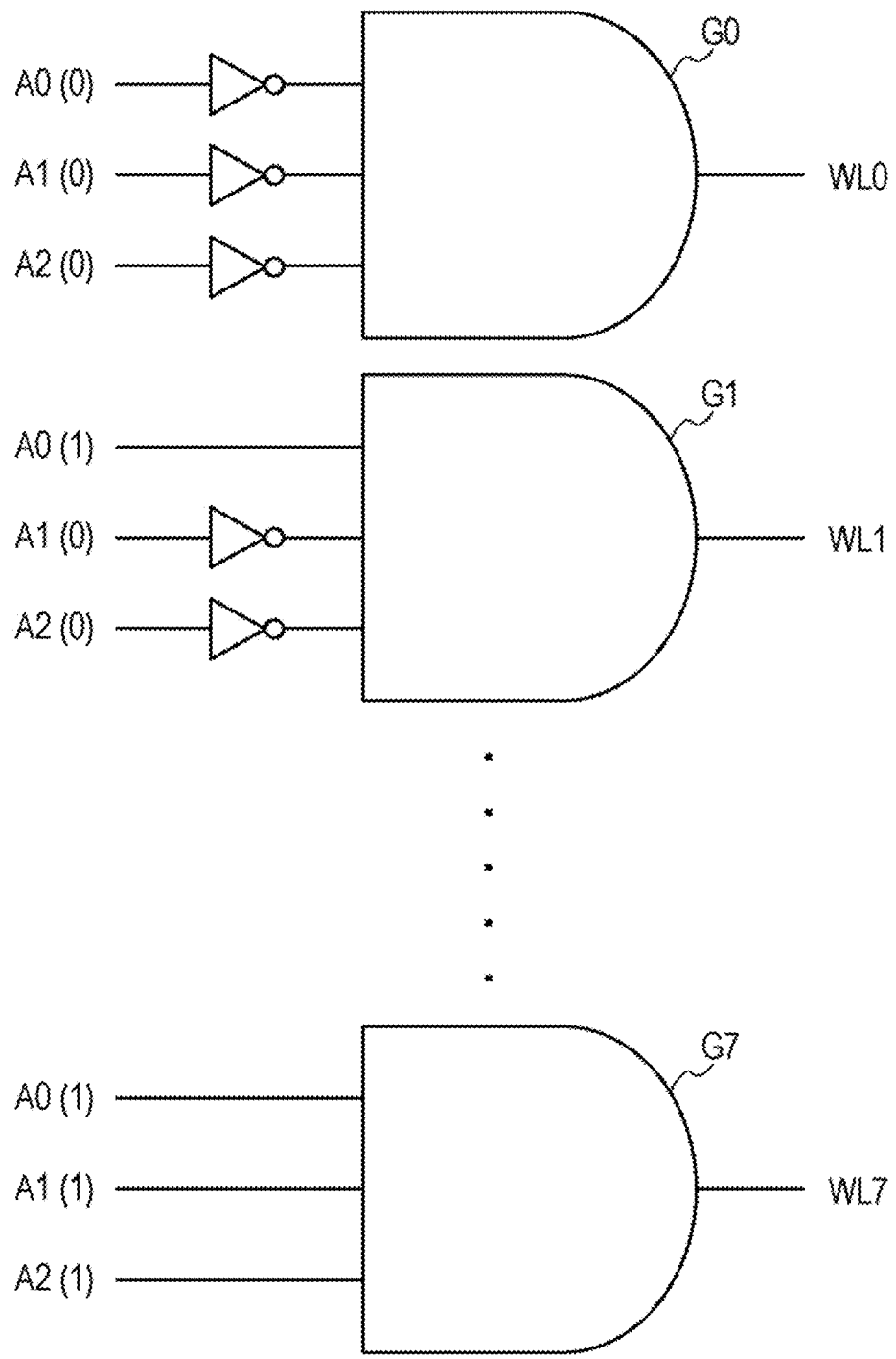
FIG. 9 illustrates processing performed by a decoder recognition unit.

FIG. 9 is a diagram illustrating processing performed by the decoder recognition unit 113.

As described above, the decoder recognition unit 113 back-traces a logic gates using a selection signal line recognized by the cell array recognition unit 112 as a starting point. Thus, the decoder recognition unit 113 recognizes the area of an address decoder. In this processing, the following feature of the circuit configuration of an address decoder is used: only one output signal becomes "1" for one set of input signals representing one value (an address signal). In this way, the decoder recognition unit 113 recognizes the area of an address decoder. Since an address decoder has such a feature in its circuit configuration, the address decoder is basically a circuit that computes the logical AND of input signals for one selection signal line on the output side.

FIG. 9 illustrates an example of a row address decoder to which a 3-bit address signal is inputted in order to select one eight word line. In FIG. 9, output signals WL0 to WL7 are enable signals to be outputted to the 0th to 7th word lines, respectively. Input signals A0 to A2 represent bits of the input address signal from the least significant bit. For example, when the value of the address signal is "100" the value of the input signal A0 is "0" (represented as "A0 (0)"), the value of the input signal A1 is "0" (represented as "A1 (0)"), and the value of the input signal A2 is "1" (represented as "A2 (1)").

In FIG. 9, when an address signal that sets the output signal WL0 to "1" is "000", a circuit area connected to the 0th word line in the row address decoder is expressed as an AND gate G0 that provides a logical AND of the inverted signals of the input signals A0 to A2. In addition, when an address signal that sets the output signal WL1 to "1" is "001", a circuit area connected to the first word line in the row address decoder is expressed as an AND gate G1 that provides a logical AND of the input signal A0 and the inverted signals of the input signals A1 and A2. Furthermore, when an address signal that sets the output signal WL7 to "1" is "111", a circuit area connected to the 7th word line in the row address decoder is expressed as an AND gate G7 that provides a logical AND of the input signals A0 to A2.

Note that, in actual row address decoders, an input terminal of each of the input signals A0 to A2 is often shared by the AND gates G0 to G7. In addition, the circuit areas corresponding to the AND gates G0 to G7 may partially overlap with one another.

In each of the circuit areas corresponding to the AND gates G0 to G7, it may be considered that AND gates that outputs an output signal of "1" are connected in series from an input end to output end of the area. Therefore, by sequentially tracing, from the output end to the input end, AND gates that output an output signal of "1" or logic elements that perform the operations equivalent to those of the AND gates, circuit areas that function as the AND gates G0 to G7 may be recognized. In this way, by performing such back-tracing, the decoder recognition unit 113 recognizes circuit areas of an address decoder for each of the selection signal lines.

Figure 10:
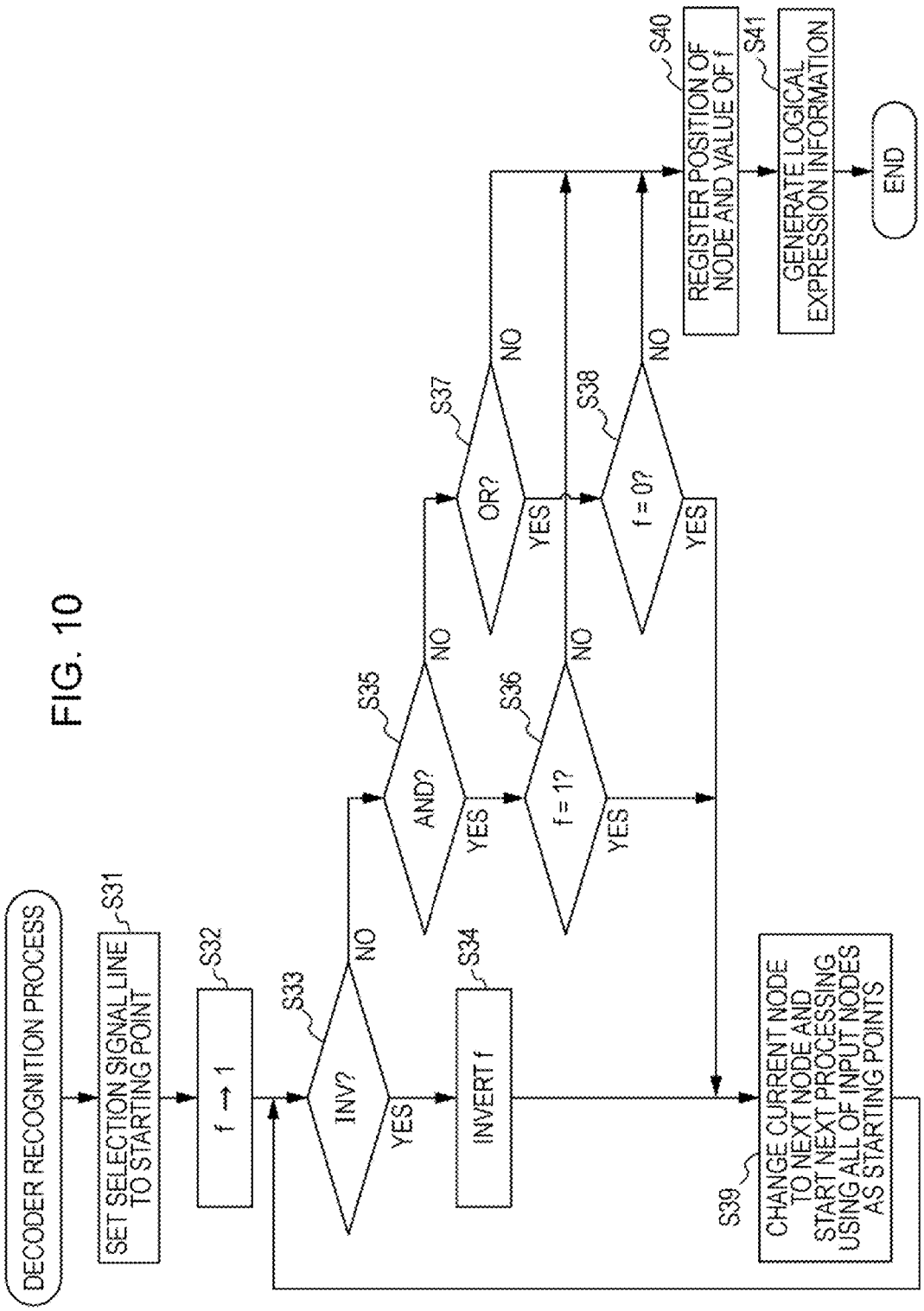
FIG. 10 is a flowchart illustrating processing performed by the decoder recognition unit.

FIG. 10 is a flowchart illustrating processing performed by the decoder recognition unit 113.

The decoder recognition unit 113 first selects one of the selection signal lines recognized by the cell array recognition unit 112 and sets the selected selection signal line to a starting point of a trace operation (S31). According to the embodiment, a selected selection signal line is a word line or a bit selection line. In addition, the decoder recognition unit 113 initializes the value of a variable f used for the recognition process to "1" (S32). Note that the value of the variable f indicates a signal value of a node currently recognized when the output value of the selection signal line set as a starting point is "1".

Subsequently, the decoder recognition unit 113 determines, based on the netlist 131, whether the logic element located on the input side of the current node is an inverter (S33), an AND gate (S35), or an OR gate (S37).

When it is determined that the logic element is an inverter in S33, the decoder recognition unit 113 inverts the value of the variable f (S34). Subsequently, the processing proceeds to S39, from which the recognition process for a logic element on the further upstream side is continued.

When it is determined that the logic element is an AND gate in S35, the decoder recognition unit 113 determines whether or not the current value of the variable f is "1" (S36). When the current value of the variable f is "1", that is, when the output signal of the recognized AND gate is "1", it is determined that the AND gate is part of the address decoder. In this case, the processing performed by the decoder recognition unit 113 proceeds to S39, from which the recognition process for a logic element on the further upstream side is continued.

However, when the current value of the variable f is determined as "0" in S36, it is determined that the recognized AND gate is located outside the address decoder. In this case, the decoder recognition unit 113 registers the output node of the recognized AND gate as a boundary of the address decoder on the input side and registers the value of the variable f in association with the registered information (S40). Note that this information may be temporarily stored in the RAM 102, for example.

In contrast, when it is determined that the logic element is an OR gate in S37, the decoder recognition unit 113 determines whether or not the current value of the variable f is "0" (S38). In the determination process performed in S38, when the recognized OR gate logically operates in a complementary fashion with respect to an AND gate, it may be considered that the OR gate is equivalent to the AND gate. Accordingly, when the current value of the variable f is "0", that is, when the output signal of the OR gate is "0", the decoder recognition unit 113 determines that the OR gate is part of the address decoder. In this case, the processing performed by the decoder recognition unit 113 proceeds to S39, from which the recognition process for a logic element on the further upstream side is continued.

However, when the current value of the variable f is determined as "1" in S38, the decoder recognition unit 113 determines that the recognized OR gate is located outside the address decoder. In this case, the decoder recognition unit 113 registers the output node of the OR gate as a boundary of the address decoder on the input side and registers the value of the variable f in association with the registered information (S40).

When, through the determination processes performed in S33, S35, and S37, a logic element serving as an inverter, an AND gate, or an OR gate is not recognized, the decoder recognition unit 113 registers the output node, that is, the input node of the immediately previously recognized logic element, as the boundary of the address decoder on the input side and registers the value of the variable f in association with the registered information (S40).

However, when through the determination processes performed in S33, S35, and S37, any logic element serving as an inverter, an AND gate, or an OR gate is not recognized immediately after the selection signal line is set as a starting point in S31, the decoder recognition unit 113 writes information indicating that an address decoder is not recognized into the verification result information 133, in place of performing the process in S40.

In addition, when it is determined in S36 that the value of the variable f is "0" immediately after the selection signal line is set as a starting point in S31, or when it is determined in S38 that the value of the variable f is "1", the decoder recognition unit 113 writes information indicating that an address decoder is not recognized into the verification result information 133, in place of performing the process in S40.

After the value of the variable f is inverted in S34 or after it is determined in S36 or S38 that the recognized gate is part of the address decoder, the decoder recognition unit 113 changes the node to be recognized to the input node of the currently recognized logic element (S39) and performs the processes in S33 to S38.

Here, an AND gate and an OR gate have a plurality of input nodes. When an AND gate and an OR gate have a plurality of input nodes, the decoder recognition unit 113 regards all of the nodes as nodes to be recognized and, therefore, performs the processes in S33 to S38 on each of the input nodes. Accordingly, when an address decoder is correctly recognized through the recognition process using one selection signal line as a starting point, the number of signal lines recognized on the input side of the recognized circuit increases as an AND gate or an OR gate that satisfies the above-described condition is increasingly recognized. Finally, the same number of information items as the number of bits of the input signal is registered in S40.

After the process in S40 is completed, the decoder recognition unit 113 generates the logical expression information 132 that indicates a relationship between an input and an output of the circuit area of the recognized address decoder (S41). In S41, each of the positions registered as the boundaries on the input side is associated with one of the bits of an address signal, and the logical value of each of the bits is used as the value of the registered variable f. Thus, a computing expression for computing a logical AND is generated. Such a computing expression may be obtained for each of the selection signal lines serving as the starting points for the recognition process. That is, the computing expressions obtained for the selection signal lines represent the value of an address signal inputted for selecting one of the selection signal lines. Thereafter, as described in more detail below, by verifying these computing expressions, it may be verified that the address decoder has a correct configuration.

Figure 11:
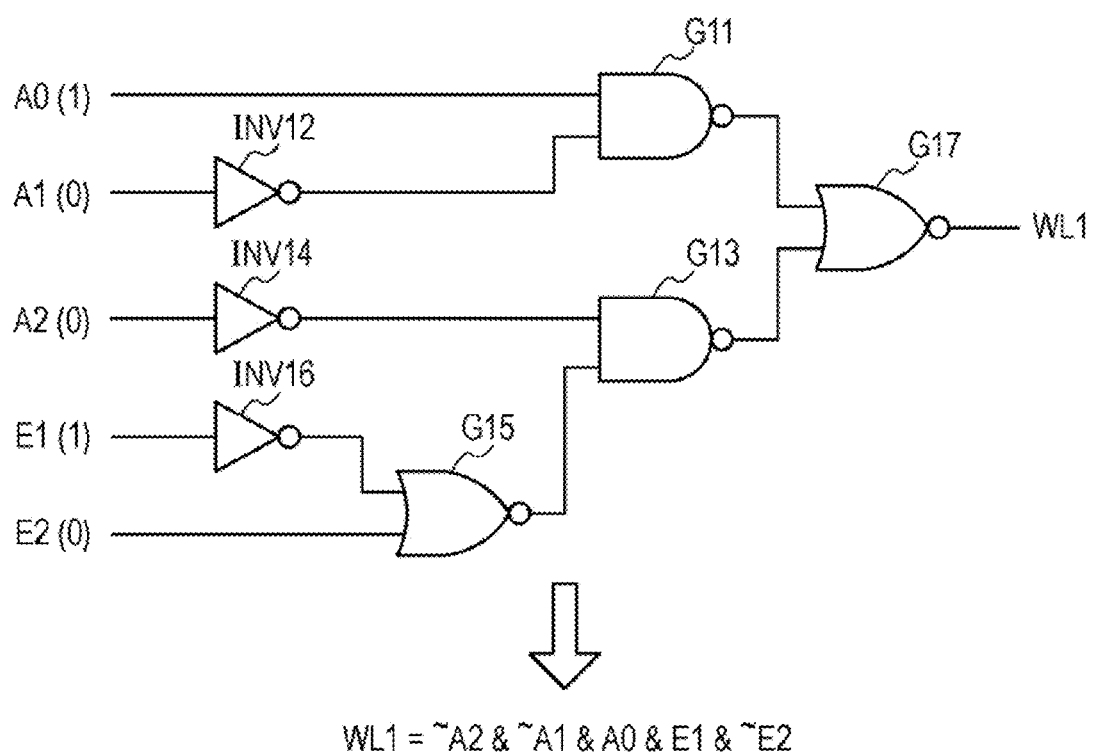
FIG. 11 illustrates part of the circuit configuration of an address decoder.

FIG. 11 illustrates a circuit configuration of an address decoder.

In FIG. 11, as an example, the configuration of a circuit area in the row address decoder for selecting the first word line illustrated in FIG. 9 is illustrated. Note that, in FIG. 11, in addition to an address signal, control signals E1 and E2 are inputted to the address decoder. Each of the control signals E1 and E2 has the same value for all of the word lines. The control signals E1 and E2 are attached to the address signal on the higher bit side. In the circuit illustrated in FIG. 11, when the value of the input signal including the address signal and the control signal is "01001", the first word line is correctly selected.

In the circuit illustrated in FIG. 11, the input signal A0 and an inverted form of the input signal A1 inverted by an inverter INV12 are inputted to a NAND gate G11. An inverted form of the input signal A2 inverted by an inverter INV14 and the output signal outputted from a NOR gate G15 are input to a NAND gate G13. An inverted form of the control signal E1 inverted by an inverter INV16 and the control signal E2 are inputted to a NOR gate G15. The output signals outputted from the NAND gates G11 and G13 are inputted to a NOR gate G17.

The case in which the decoder recognition process illustrated in FIG. 10 is applied to the circuit illustrated in FIG. 11 is described below. When the first word line is determined to be a starting point (S31), the NOR gate G17 is recognized as a logic element. In general, a NOR gate is equivalent to a circuit in which an inverter is connected to the output of an OR gate. Accordingly, the decoder recognition unit 113 recognizes an inverter (S33) and inverts the variable f to "0" (S34). Subsequently, the decoder recognition unit 113 recognizes an OR gate (S37). At that time, since the variable f is "0" (S38), the recognition target is moved to an input node of the OR gate, that is, an input node of the NOR gate G17 (S39).

In this case, among the input nodes of the NOR gate G17, nodes for lower-order bits (the upper portion of FIG. 11) are determined to be recognition targets, as an example. The decoder recognition unit 113 recognizes the NAND gate G11. In general, a NAND gate is equivalent to a circuit in which an inverter is connected to the output of an AND gate. Accordingly, the decoder recognition unit 113 recognizes an inverter (S33) and inverts the variable f to "1" (S34). Subsequently, the decoder recognition unit 113 recognizes an AND gate (S35). At that time, since the variable f is "1" (S36), the recognition target is moved to an input node of the AND gate, that is, an input node of the NAND gate G11 (S39).

When, among input nodes of the NAND gate G11, an input node on the lower bit side (the upper side in FIG. 11), as an example, is recognized, no logic element is found in this node. Accordingly, the decoder recognition unit 113 recognizes that the input node located on the lower bit side of the NAND gate G11 is the least significant bit of the address signal, that is, an input terminal of the input signal A0. In addition, the decoder recognition unit 113 registers the logical value of the input signal A0 as "1" (S40).

In this way, all of the logic gates are recognized from the input side. As a result, input nodes of the inverters INV12, INV14, and INV16 are recognized as input terminals of the input signals A1 and A2 and the control signal E1, respectively. In addition, an input node of the NOR gate G15 on the higher bit side (the lower side in FIG. 11) is recognized as an input terminal of the control signal E2. Furthermore, logical values "0", "0", "1", and "0" are registered so as to correspond to the input signals A1 and A2 and the control signals E1 and E2, respectively. Thereafter, the decoder recognition unit 113 outputs a logical expression shown on the bottom of FIG. 11, which is a logical expression that indicates a relationship between the output signal WL1 and the corresponding input signals (S41).

Note that, when a logic element is recognized and if input signals are S1 and S2, a logical expression (S1 & S2)|(S1 & S2) may be replaced with the equivalent logical expression (S1 & S2) and, subsequently, logic elements may be recognized. By recognizing logic elements while simplifying a logical expression in this manner, the processing load may be reduced.

The verification processing unit 120 is described next.

Figure 12:
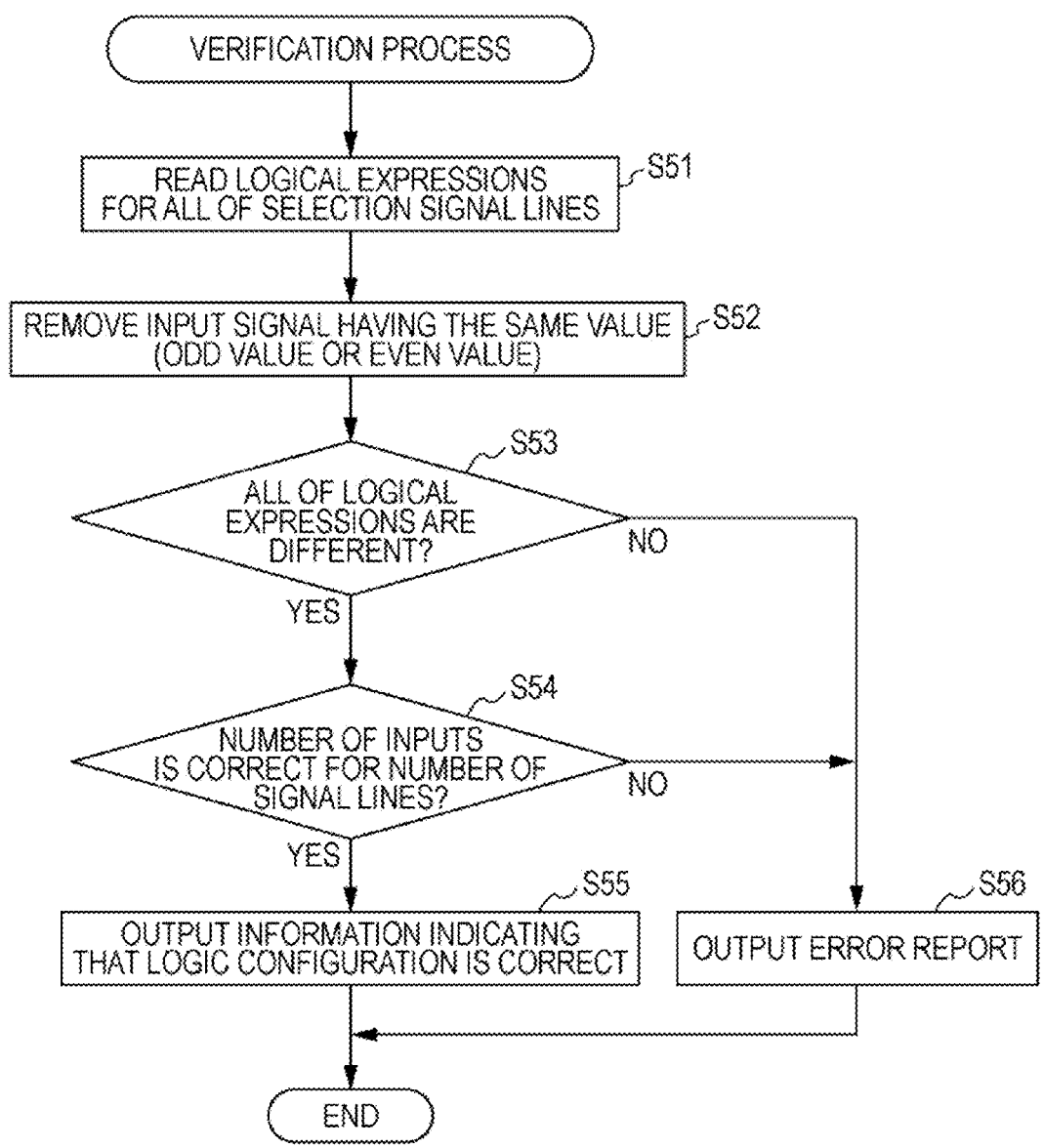
FIG. 12 is a flowchart illustrating processing performed by a verification processing unit.

FIG. 12 is a flowchart of processing performed by the verification processing unit 120. The verification processing unit 120 examines whether the logical configuration of a recognized address decoder is correct based on the logical expression information 132 outputted from the decoder recognition unit 113. The decoder recognition unit 113 reads all of the logical expressions corresponding to all of the selection signal lines from the logical expression information 132 (S51). Note that, when a plurality of types of selection signal lines (e.g., word lines and bit selection lines in the present embodiment) have been recognized through the processing performed by the circuit recognition unit 110, the following processing is performed for each of the types of selection signal lines.

Subsequently, the decoder recognition unit 113 determines whether an input signal having the same value (an even value or an odd value) for all of the selection signal lines is present. When an input signal that meets this condition is present, the decoder recognition unit 113 removes such an input signal from each of the logical expressions (S52). It may be considered that such an input signal is not an address signal, but a control signal used for selecting the entire address decoder, for example. Accordingly, such a signal is removed from verification processing in S52.

Subsequently, the decoder recognition unit 113 determines whether all of the logical expressions corresponding to the selection signal lines are different (S53). Since only one selection signal line is selected for one set of input signals in an address decoder, all of the logical expressions indicating the relationship between an input and an output are different when the address decoder is correctly configured.

When it is determined that all of the logical expressions are different in S53, the verification processing unit 120 further determines that the number of the input signals is correct for the number of the signal lines on the output side (S54). When the number of selection signal lines selected by the address decoder is 2n (where n is a natural number), the number of bits of the address signal inputted to the address decoder is n and, therefore, the number of input signals is n. For example, as illustrated in FIG. 9, when the number of the word lines selected by the address decoder is eight, an address signal having three bits is inputted to the address decoder. In S54, it is determined whether the logical expression satisfies such a condition.

When it is determined that the number of the input signals is correct in S54, the verification processing unit 120 outputs the verification result information 133 indicating that the logical configuration of the address decoder is correct (S55).

However, when it is determined in S53 that some of the logical expressions are the same, or when it is determined in S54 the number of the input signals is incorrect, the verification processing unit 120 determines that the logical configuration of the address decoder has an error and, therefore, outputs the verification result information 133 containing error information (S56).

Note that, in the above-described flowchart, the determination made in S53 and the determination made in S54 may be reversed.

An example of the logical expression information 132 is described next and, subsequently, a determination process performed based on the logical expression information 132 is described.

Figure 13:
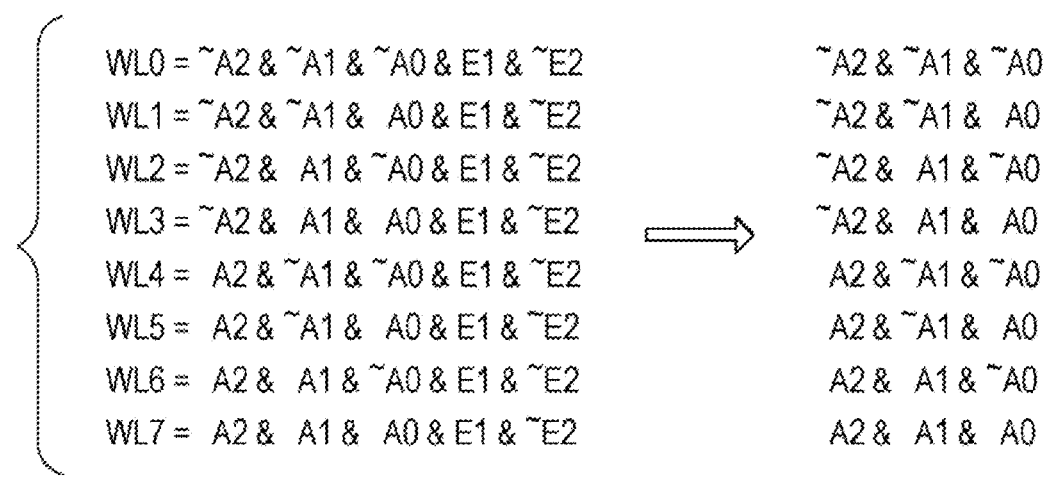

FIG. 13 illustrates a first example of the logical expression information 132.

In FIG. 13, each of the logical expressions written to the left of the arrow indicates a logical expression generated through the decoder recognition process started from the corresponding eight word line. In addition, each of the logical expressions written to the right of the arrow represents a logical expression obtained by removing, from the corresponding logical expression written to the left of the arrow, an input signal having the same value (an odd value or an even value) for all of the logical expressions written to the right of the arrow through the processing performed in S52 of FIG. 12. This notation similarly applies to FIGS. 13 to 17. In the example of FIG. 13, since each of the logical expressions written to the left of the arrow includes the control signal E1 and an inverted value of the control signal E2, the logical expression written to the right of the arrow is a logical expression obtained by removing the control signals E1 and E2 from the logical expression written to the left of the arrow. Thus, the logical expression written to the right of the arrow contains only the input signals corresponding to the address signal.

All of the logical expressions written to the left of the arrow are different. In addition, since the number of the word lines is eight, the number of bits of the address signal is "3". Each of the logical expressions written to the right of the arrow includes three types of input signals: A0, A1, and A2. Accordingly, it may be determined, from the logical expression information 132, that the logical configuration of the row address decoder is correct.

Figure 14:
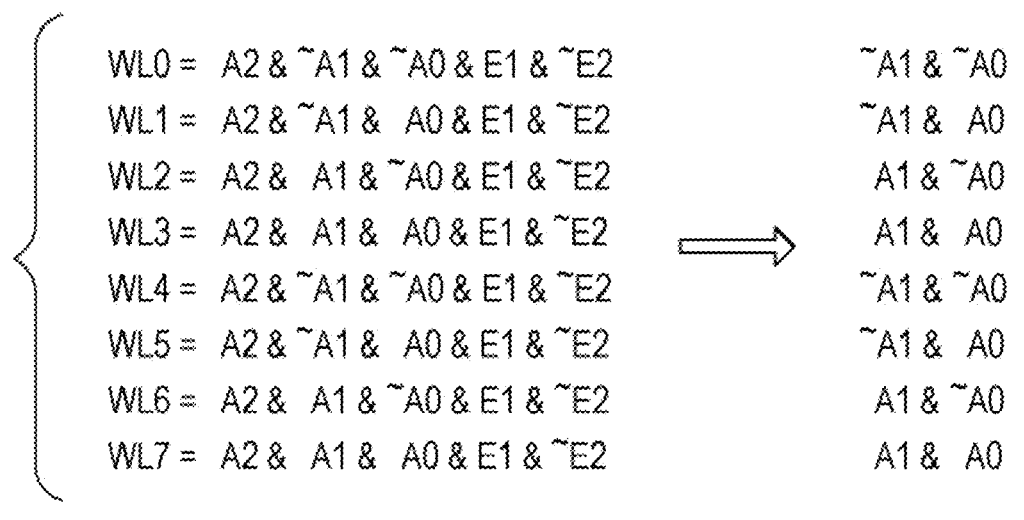

FIG. 14 illustrates a second example of the logical expression information 132.

In the example illustrated in FIG. 14, when an input signal having the same value (an even value or an odd value) for all of the logical expressions is removed from each of the logical expressions written to the left of the arrow, only two types of input signals remain, as illustrated in the logical expressions to the right of the arrow. Accordingly, through the logic verification processing described above, it is determined that an error is found. Note that, in this example, since the logical expressions corresponding to the output signals WL0 and WL4 are the same, it may be determined, using this information, that an error is found.

Figure 15:
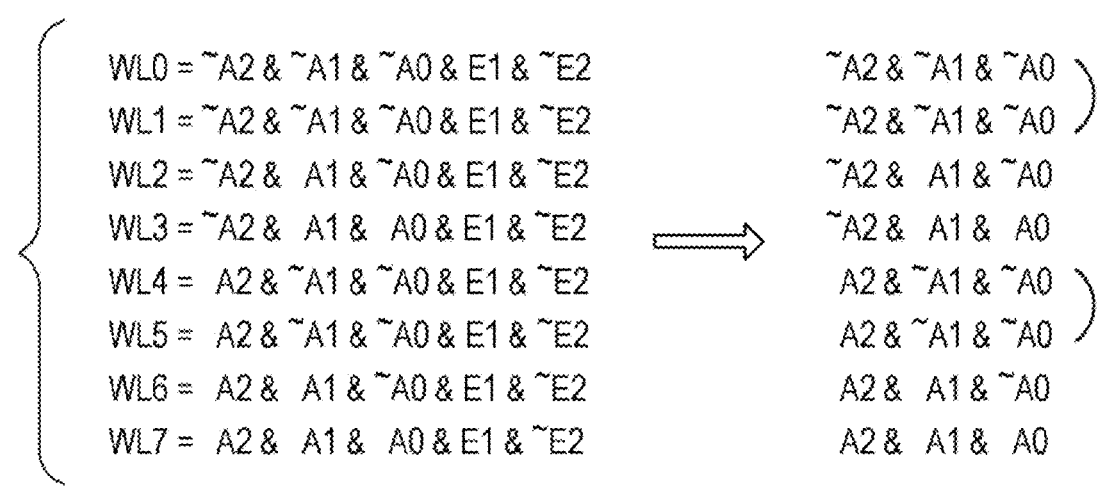

FIG. 15 illustrates a third example of the logical expression information 132.

In the example illustrated in FIG. 15, the logical expressions corresponding to the output signals WL0 and WL1 are the same. In addition, the logical expressions corresponding to the output signals WL4 and WL5 are the same. Accordingly, through the logic verification processing described above, it is determined that an error is found.

Figure 16:
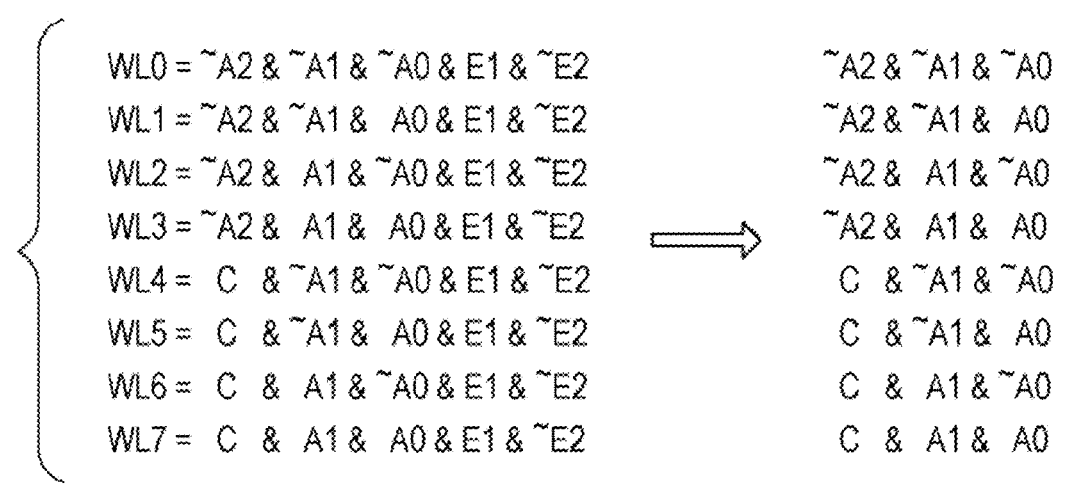

FIG. 16 illustrates a fourth example of the logical expression information 132.

In the example illustrated in FIG. 16, due to an error in the logic configuration, an input signal C that is not related to an address signal and a control signal appears in the logical expression. At that time, since the logical expressions to the right of the arrow contain four types of input signals: A0, A1, A2, and C, it is determined, through the logic verification processing described above, that an error is found.

Figure 17:
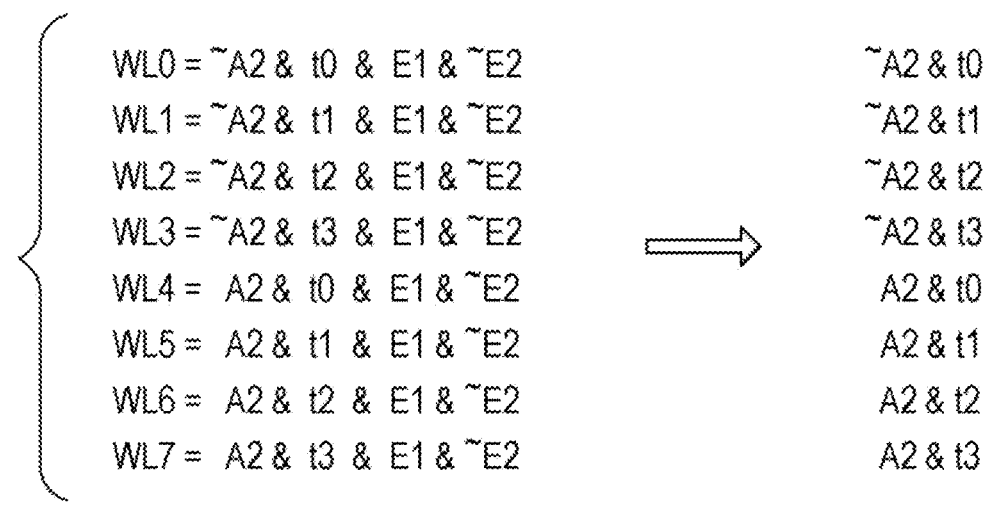

FIG. 17 illustrates a fifth example of the logical expression information 132.

In the example illustrated in FIG. 17, a wrong type of logic gate is used in the recognized address decoder area. For example, if an AND gate, which receives the input signal A1 and the inverted signal of the input signal A0 and outputs a signal t1, is changed to an OR gate by mistake, the logical expressions shown in FIG. 17 may be obtained. For this example, since the logical expressions to the right of the arrow contain five types of signals: an input signal A0 and signals t0, t1, t2, and t3, it is determined, through the logic verification processing described above, that an error is found.

Figure 18:
FIG. 18 illustrates error information that is written into verification result information.

FIG. 18 illustrates an example of error information that is written into the verification result information 133. FIG. 18 illustrates six types of character string information written as the verification result information 133 when, as a result of the logic verification processing described above, an error is found. The first line (error number "0124") indicates that the number of columns of the cell array or connection between the circuits in each column is incorrect. The second line (error number "0125") indicates that the number of rows of the cell array or connection between the circuits in each row is incorrect. The third line (error number "0126") indicates that connection of a selection signal line is incorrect. For example, the information indicated by the first to third lines is detected through the recognition processing performed by the cell array recognition unit 112 and is output.

The fourth line (error number "0127") indicates that an address decoder has not been recognized. For example, this information is output if, in the processing performed by the decoder recognition unit 113, a logic element that satisfies the condition is not present on the input side of a selection signal line serving as a starting point.

The information indicated by the fifth and sixth lines is output as a result of the verification processing performed by the verification processing unit 120. The fifth line (error number "0120") indicates that the number of input signals input to the recognized decoder is incorrect. The sixth line (error number "0122") indicates that, among the logical expressions corresponding to the selection signal lines, the same logical expressions are found.

While the foregoing embodiments have been described with reference to logic verification for a RAM in which the bit lines are connected to a MUX, the present invention is not limited thereto. For example, for a RAM in which no MUX is provided and the bit lines are directly connected to a column address decoder, the decoder recognition processing illustrated in FIG. 10 may be performed using each of the bit lines as a starting point and, subsequently, the verification processing illustrated in FIG. 12 may be performed.

The above-described logic verification apparatus 1 may recognize the circuit area of an address decoder on the basis of the circuit design information regarding the RAM and perform verification of a logic configuration in the circuit area in a simplified manner using the features of the configuration of the address decoder. In addition, in this processing, unlike the logic simulation and symbolic simulation, the need for generation of a reference model or a test bench is eliminated. Accordingly, the designer is not required to have high skills. As a result, most steps of the logic verification steps for a RAM may be automatically performed without designer intervention and without overloading a processor.

In addition, the logic simulation or symbolic simulation may be used for verifying a circuit area other than the address decoder. Even in such a case, the entire logic verification processing for a RAM may be performed in a short time, and therefore, the operation cost may be reduced.

Furthermore, at least some of the functions of the logic verification apparatus 1 may be realized by a computer. In such a case, a program defining the processing for the functions is provided. By executing the program by the computer, the functions are realized. The program defining the processing for the functions may be stored in a computer-readable recording medium. Examples of the computer-readable recording medium include, but are not limited to, a magnetic recording unit, an optical disc, a magneto-optical recording medium, and a semiconductor memory.

In order to distribute the program, for example, a removable recording medium (e.g., an optical disc) including the program is made commercially available. In addition, the program may be stored in a storage unit of a server computer, and the program may be transferred from the server computer to a different computer via a network.

A computer that executes the program stores, in a storage unit thereof, the program recorded in a removable recording medium or the program transferred from a server computer. Subsequently, the computer reads the program from the storage unit of the computer and performs the processing in accordance with the readout program. Alternatively, the computer may directly read the program from a removable recording medium and perform the processing in accordance with the readout program. Furthermore, every time the program is transferred from the server computer, the computer may perform the processing in accordance with the received program.

What is claimed is:

1. A method of verifying a logic circuit group including a decoder that decodes a selection signal that are inputted to the decoders and selects a selected output signal line among a plurality of signal lines, the method executed by a computer comprising:

recognizing, by the computer, each of the signal lines in a circuit group based on design information regarding the circuit group;

recognizing, by the computer, logic elements located on an input side of the circuit group based on the design information by using each of the recognized signal lines as a starting point;

recognizing, by the computer, a circuit area including a logic element and an inverter as a decoder circuit area, the logic element and the inverter operating as an AND gate, the logic element and the inverter being able to output a signal having a logical value "1";

determining, by the computer, a combination of logical values of selection signals inputted to the recognized decoder circuit area when a logical value of the starting point is logical value "1";

determining, by the computer, whether a logical configuration of the recognized decoder circuit area is correct based on the number of the selection signals inputted to recognized decoder circuit area and the combination of logical values of the selection signals; and outputting, by the computer, a determination result, wherein the logical configuration of the recognized decoder circuit area is determined correct when the number of the selection signals inputted to the recognized decoder circuit area is the same as the number of bits represented by the selection signals for selecting the selected signal line, and when all of the combination of logical values of the selection signals inputted to the decoder circuit areas are different from one another, each of the combination of logical values of the selection signals causing anyone of the decoder circuit area to output a signal having a logical value "1".

2. The method according to claim 1, wherein the decoder decodes the n-bit selection signal and selects one of the 2n signal lines, where n is a natural number.

3. The method according to claim 1, further comprising:
initially setting, by the computer, a logical value flag to "1" when recognizing the decoder circuit area;
recognizing, by the computer, logic elements located on the input side of the circuit group by using each of the signal lines as the starting point,
inverting, by the computer, the value of the logical value flag when an inverter is recognized as a logic element; and
determining, by the computer, the value of the logical value flag that is inverted as a logical value of an input signal inputted across a boundary when the boundary of the decoder circuit area is recognized.

4. The method according to claim 3, further comprising:
when an AND gate is recognized as a logic element, continuing, by the computer, the recognition process of the logic elements located on the input side of the recognized AND gate for each of the input terminals of the AND gate when the logical value flag is "1", and, when the logical value flag is "0", recognizing, by the computer, an output node of the AND gate as the boundary of the decoder circuit area and determining, by the computer, a current value of the logical value flag as a logical value of an input signal inputted across the boundary.

5. The method according to claim 4, further comprising:
when an OR gate is recognized as a logic element, continuing, by the computer, the recognition process of the logic elements located on the input side of the OR gate for each of the input terminals of the OR gate when the logical value flag is "0", and
when the logical value flag is "1", recognizing, by the computer, an output node of the logical OR gate as the boundary of the decoder circuit area and determining a current value of the logical value flag as a logical value of an input signal inputted across the boundary.

6. The method according to claim 1, further comprising, when the circuit group to be logic-verified includes an array circuit that selects anyone of unit circuits arranged in an array using the signal lines, recognizing, by the computer, the unit circuits based on the design information and verifying, by the computer, connection states among the recognized unit circuits so as to recognize the signal lines.

7. The method according to claim 6, wherein the circuit group includes a semiconductor memory having memory cells serving as the unit circuits arranged in the array.

8. The method according to claim 1, further comprising:
when determining whether the logical configuration of the decoder circuit area is correct, excluding, by the computer, an input signal having the same logical value for the recognized decoder circuit areas, and determining, by the computer, whether the logic configuration of the decoder circuit area is correct based on the number of the remaining input signals and the logical values of the remaining input signals.

9. A logic verification apparatus for verifying a logic circuit group including a decoder that decodes a selection signal and selects one signal line from a plurality of signal lines, the apparatus comprising:
at least one processor;
said processor executing a program read from a storage medium storing said program thereon, the program comprising:
a signal line recognition unit that recognizes signal lines in the logic circuit based on design information regarding the logic circuit as a starting point;
a decoder recognition unit that recognizes a circuit area including a logic element and an inverter as a decoder circuit area, the logic element and the inverter operating as an AND gate, the logic element and the inverter being able to output a signal having a logical value "1", and determines a combination of logical values of selection signals inputted to the recognized decoder circuit area when a logical value of the starting point is logical value "1"; and
a determination unit that determines whether a logical configuration of the recognized decoder circuit area is correct based on the number of the selection signals, and the combination of logical values of the selection signals, wherein the logical configuration of the recognized decoder circuit area is determined correct when the number of the selection signals inputted to the recognized decoder circuit area is the same as the number of bits of represented by the selection signal for selecting the signal line, and when all of the combination of logical values of the selection signals inputted to the decoder circuit areas are different from one another, each of the combination of logical values of the selection signals causing anyone of the decoder circuit area to output a signal having a logical value "1".

10. A computer-readable recording medium storing a logic verification program for verifying a logic circuit group including a decoder that decodes a selection signal and selects one signal line of a plurality of signal lines, the program causing a computer to function as:
a signal line recognition unit configured to recognize each of the signal lines in the circuit group based on design information regarding the circuit group;
a decoder recognition unit configured to sequentially recognize logic elements located on an input side of the circuit group by using each of the recognized signal lines as a starting point based on the design information so as to recognize, as a decoder circuit area, an area including a logic element and inverter operating as an AND gate for outputting a signal having a logical value of "1", and configured to determine a combination of logical values of the selection signals inputted to the decoder circuit area when a logical value of the signal line serving as the starting point is "1"; and
a determination unit configured to determine whether a logical configuration of the decoder circuit area is correct based on the number of the selection signals inputted to the decoder circuit area and the combination of logical values of the selection signals, wherein the logical configuration of the recognized decoder circuit area is determined correct when the number of the selection signals inputted to the recognized decoder circuit area is the same as the number of bits of represented by the selection signal for selecting the signal line, and when all of the combination of logical values of the selection signals inputted to the decoder circuit areas are different from one another, each of the combination of logical values of the selection signals causing anyone of the decoder circuit area to output a signal having a logical value "1".

* * * * *